(12) United States Patent
Li et al.

(10) Patent No.: US 11,810,752 B2
(45) Date of Patent: Nov. 7, 2023

(54) CHARGED PARTICLE BEAM DEVICE AND POWER SUPPLY DEVICE

(71) Applicant: Hitachi High-Tech Corporation, Tokyo (JP)

(72) Inventors: Wen Li, Tokyo (JP); Hiroyuki Takahashi, Tokyo (JP); Makoto Suzuki, Tokyo (JP); Yuzuru Mizuhara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 339 days.

(21) Appl. No.: 17/396,866

(22) Filed: Aug. 9, 2021

(65) Prior Publication Data

US 2022/0068595 A1    Mar. 3, 2022

(30) Foreign Application Priority Data

Aug. 27, 2020   (JP) .................................. 2020-143072

(51) Int. Cl.
*H01J 37/24*         (2006.01)
*H01J 37/244*       (2006.01)
(Continued)

(52) U.S. Cl.
CPC .......... *H01J 37/243* (2013.01); *H01J 37/244* (2013.01); *H02M 3/07* (2013.01); *H01J 37/26* (2013.01);
(Continued)

(58) Field of Classification Search
CPC ........ H01J 37/243; H01J 37/244; H01J 37/26; H01J 2237/04735; H01J 2237/24564;
(Continued)

(56) References Cited

U.S. PATENT DOCUMENTS 7,015,468 B1   3/2006   Azordegan et al.
7,683,319 B2   3/2010   Makino et al.
(Continued)

FOREIGN PATENT DOCUMENTS

JP    H1012684 A      1/1998
JP    2003303568 A   10/2003
(Continued)

*Primary Examiner* — Rebecca C Bryant
*Assistant Examiner* — Christopher J Gassen
(74) *Attorney, Agent, or Firm* — MILES & STOCKBRIDGE, P.C.

(57) ABSTRACT

The invention provides a power supply device and a charged particle beam device capable of reducing noise generated between a plurality of voltages. The charged particle beam device includes a charged particle gun configured to emit a charged particle beam, a stage on which a sample is to be placed, and a power supply circuit configured to generate a first voltage and a second voltage that determine energy of the charged particle beam and supply the first voltage to the charged particle gun. The power supply circuit includes a first booster circuit configured to generate the first voltage, a second booster circuit configured to generate the second voltage, and a switching control circuit configured to perform switching control of the first booster circuit and the second booster circuit using common switch signals.

15 Claims, 9 Drawing Sheets

(51) Int. Cl.
*H02M 3/07* (2006.01)
*H01J 37/26* (2006.01)

(52) U.S. Cl.
CPC ............... *H01J 2237/04735* (2013.01); *H01J 2237/2485* (2013.01); *H01J 2237/24564* (2013.01)

(58) Field of Classification Search
CPC ..... H01J 2237/2485; H01J 2237/04756; H01J 37/241; H02M 3/07; H02M 7/53806; H02M 3/3374; H02M 7/103
See application file for complete search history.

(56) References Cited

U.S. PATENT DOCUMENTS

| | | | |
|---|---|---|---|
| 8,153,966 B2 | 4/2012 | Arai et al. | |
| 9,202,665 B2 | 12/2015 | Matsui et al. | |
| 10,546,718 B2* | 1/2020 | Nishimoto | H01J 37/244 |
| 10,973,112 B2* | 4/2021 | Kadoi | H01J 37/241 |
| 11,348,758 B2* | 5/2022 | Suga | H01J 37/248 |
| 2003/0193024 A1 | 10/2003 | Takagi | |
| 2006/0054815 A1 | 3/2006 | Bertsche et al. | |
| 2007/0210250 A1 | 9/2007 | Ward et al. | |
| 2008/0277583 A1* | 11/2008 | Yano | H01J 37/026 250/310 |
| 2009/0039281 A1 | 2/2009 | Kawasaki et al. | |
| 2009/0166557 A1 | 7/2009 | Makino et al. | |
| 2009/0206257 A1 | 8/2009 | Gunji et al. | |
| 2010/0012838 A1 | 1/2010 | Hatakeyama et al. | |
| 2010/0032566 A1 | 2/2010 | Naito et al. | |
| 2011/0204263 A1 | 8/2011 | Phaneuf et al. | |

FOREIGN PATENT DOCUMENTS

| | | |
|---|---|---|
| JP | 2006114426 A | 4/2006 |
| JP | 2006234789 A | 9/2006 |
| JP | 2009192345 A | 8/2009 |
| JP | 2009277587 A | 11/2009 |
| JP | 2010211973 A | 9/2010 |
| JP | 2012155980 A | 8/2012 |
| WO | 2007051313 A1 | 5/2007 |

\* cited by examiner

CHARGED PARTICLE BEAM DEVICE AND POWER SUPPLY DEVICE

BACKGROUND OF THE INVENTION

1. Field of the Invention

The present invention relates to a charged particle beam device and a power supply device, for example, relates to a power supply device including a booster circuit, and a charged particle beam device equipped with the power supply device.

2. Description of the Related Art

JP-A-2012-155980 discloses a charged particle beam device capable of rapidly eliminating charges generated in an irradiation region of a charged particle beam. The charged particle beam device performs charge elimination by measuring a sample under a condition that the value of a retarding voltage is smaller than the value of an accelerating voltage and then setting the difference between the value of the retarding voltage and the value of the accelerating voltage to be smaller than that at the time of measurement.

In related art, for the purpose of reducing aberration of an electron beam optical system, a retarding method as disclosed in JP-A-2012-155980 and the like is used. This method is a method in which energy of an electron beam is once set to a high energy of several tens of kV or the like by the accelerating voltage, and then the energy is decelerated to 1 kV or less or the like by a retarding voltage applied to a sample when the sample is irradiated with the electron beam. The higher the energy of the electron beam is, the shorter a wavelength becomes, and a beam size can be reduced (that is, a resolution of the electron beam can be increased). In addition, by reducing the energy of the electron beam at the time of irradiation, damage to the sample can be reduced.

Meanwhile, with the miniaturization of semiconductor devices, it is required to further improve the resolution of the electron beam. Under such a circumstance, in a general charged particle beam device, the accelerating voltage is generated by a power supply device mounted on an electron gun side, and the retarding voltage is generated by another power supply device mounted on the sample side. However, in such a configuration, noise generated between the accelerating voltage and the retarding voltage increases, and the resolution of the electron beam may not be sufficiently increased.

SUMMARY OF THE INVENTION

The invention is made in view of the above circumstances, and an object thereof is to provide a power supply device and a charged particle beam device capable of reducing noise generated between a plurality of voltages.

The above-mentioned object as well as other objects and novel features of the invention will become clear based on descriptions of the present description and accompanying drawings.

Typical embodiments of inventions disclosed in the present application will be briefly described as follows.

A charged particle beam device according to the typical embodiments of the invention includes: a charged particle gun configured to emit a charged particle beam; a stage on which a sample is to be placed; and a power supply circuit configured to generate a first voltage and a second voltage that determine energy of the charged particle beam and supply the first voltage to the charged particle gun. The power supply circuit includes a first booster circuit configured to generate the first voltage, a second booster circuit configured to generate the second voltage, and a switching control circuit configured to perform switching control of the first booster circuit and the second booster circuit using a common switch signal.

Effects exerted by typical embodiments of the inventions disclosed in the present application can be briefly described as being able to reduce noise generated between a plurality of voltages.

DESCRIPTION OF THE PREFERRED EMBODIMENTS

Figure 1:
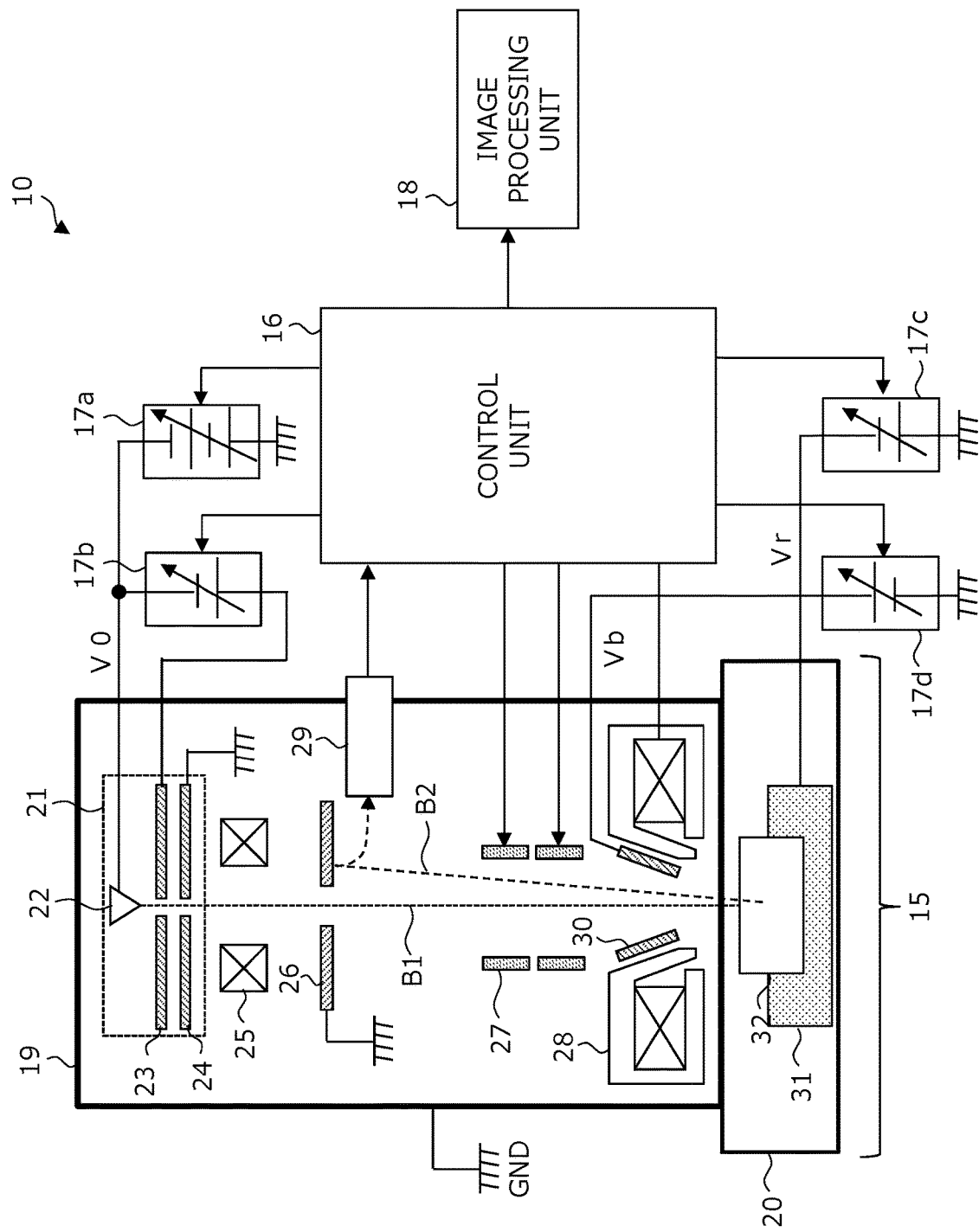
FIG. 1 is a schematic diagram illustrating a configuration example of a charged particle beam device according to a first embodiment of the invention.

Hereinafter, embodiments of the invention will be described in detail with reference to drawings. In all the drawings for describing the embodiments, the same components are denoted by the same reference numerals in principle, and repeated description thereof is omitted.

First Embodiment

<<Outline of Charged Particle Beam Device>>

FIG. 1 is a schematic diagram illustrating a configuration example of a charged particle beam device according to a first embodiment of the invention. In the description, a case where the charged particle beam device is an electron microscope device using an electron beam is taken as an example, but the charged particle beam device is not limited thereto, and may be, for example, an ion microscope device using an ion beam. In the charged particle beam device 10 of FIG. 1, schematically, a sample 32 is irradiated with an electron beam (a supercharged particle beam) B1 emitted from an electron gun (a charged particle gun) 21, and an emission amount of electrons (specifically, secondary electrons and reflected electrons) B2 emitted from the sample 32 is detected by a detector 29.

The charged particle beam device 10 illustrated in FIG. 1 includes a main body unit 15, a control unit 16, a plurality of power supply circuits 17a, 17b, 17c, and 17d, and an image processing unit 18. The main body unit 15 includes a housing 19 and a sample chamber 20. The housing 19 houses the electron gun (the charged particle gun) 21, a condenser lens 25, a reflection plate 26, a deflector 27, an objective lens 28, a detector 29, and a boost electrode 30. The electron gun 21 includes an electron source (a charged particle source) 22, an extraction electrode 23, and an acceleration electrode 24. A stage 31 on which the sample 32 is to be placed is housed in the sample chamber 20.

The housing 19 is formed of a metal member and is connected to a ground power supply GND. The power supply circuit 17a generates a negative accelerating voltage V0 and supplies the negative accelerating voltage V0 to the electron source 22. The power supply circuit 17b generates a positive extraction voltage based on the voltage (V0) of the electron source 22, and supplies the positive extraction voltage to the extraction electrode 23. The electron source 22 emits the electron beam (the charged particle beam) B1 by the extraction voltage. The acceleration electrode 24 is connected to the ground power supply GND. Accordingly, when the electron source 22 is used as a reference, a positive accelerating voltage V0 is applied to the acceleration electrode 24. The electron beam B1 emitted from the electron source 22 is accelerated by the accelerating voltage V0.

The condenser lens 25 focuses the electron beam B1 emitted from the electron gun 21. The objective lens 28 focuses the electron beam B1 such that the electron beam B1 forms a minute spot on the sample 32. In this case, the power supply circuit 17d generates a positive boost voltage Vb and supplies the positive boost voltage Vb to the boost electrode 30 installed in the vicinity of the condenser lens 25. Accordingly, the electron beam B1 accelerated by the accelerating voltage V0 is further accelerated by the boost voltage Vb. Thus, it is possible to achieve a further high resolution of the electron beam B1.

The deflector 27 is a magnetic field deflector or an electrostatic deflector, and deflects the electron beam B1 focused by the objective lens 28 to perform scan with the electron beam B1 (that is, the minute spot) emitted on the sample 32. The power supply circuit 17c generates a negative retarding voltage Vr and supplies the negative retarding voltage Vr to the stage 31. Accordingly, the electron beam B1 passed through the objective lens 28 is decelerated by the retarding voltage Vr. Thus, it is possible to reduce damage to the sample 32.

Energy of, for example, several tens of kV is applied to the electron beam B1 by the accelerating voltage V0 and the boost voltage Vb. The retarding voltage Vr decreases the energy of the electron beam B1 to, for example, 1 kV or less. As described above, the energy of the electron beam B1 is appropriately determined by the power supply circuits 17a, 17c, and 17d. The power supply circuit 17d and the boost electrode 30 may not be provided.

The sample 32 emits the electrons (specifically, the secondary electrons and the reflected electrons) B2 in response to the irradiation of the electron beam B1. The emitted electrons B2 are accelerated in the direction of the electron source 22 by the retarding voltage Vr and the boost voltage Vb, and collide with the reflection plate 26. Accordingly, the reflection plate 26 emits the secondary electrons. The detector 29 detects the emission amount of the secondary electrons.

The control unit 16 is formed of, for example, a wiring board (a control board) on which various integrated circuits (ICs) including a microcontroller and the like are mounted. The control unit 16 controls voltage values of the power supply circuits 17a, 17b, 17c, and 17d. In addition, the control unit 16 controls the deflector 27, the objective lens 28, and the like. Furthermore, the control unit 16 processes an output signal from the detector 29 using a predetermined signal processing circuit. In this case, the control unit 16 synchronizes a control signal to the deflector 27 with the output signal from the detector 29 to create original data for creating a secondary electron image of a scanning region.

The image processing unit 18 is formed of, for example, a computer such as a personal computer (PC). The image processing unit 18 acquires the original data of the secondary electron image from the control unit 16, and creates the secondary electron image based on the original data. In addition, the image processing unit 18 displays the created secondary electron image on a display or the like. The secondary electron image is an image in which the luminance varies depending on the emission amount of the secondary electrons at each position in the scanning region.

<<Details of Power Supply Circuit (Power Supply Device)>>

Figure 2:
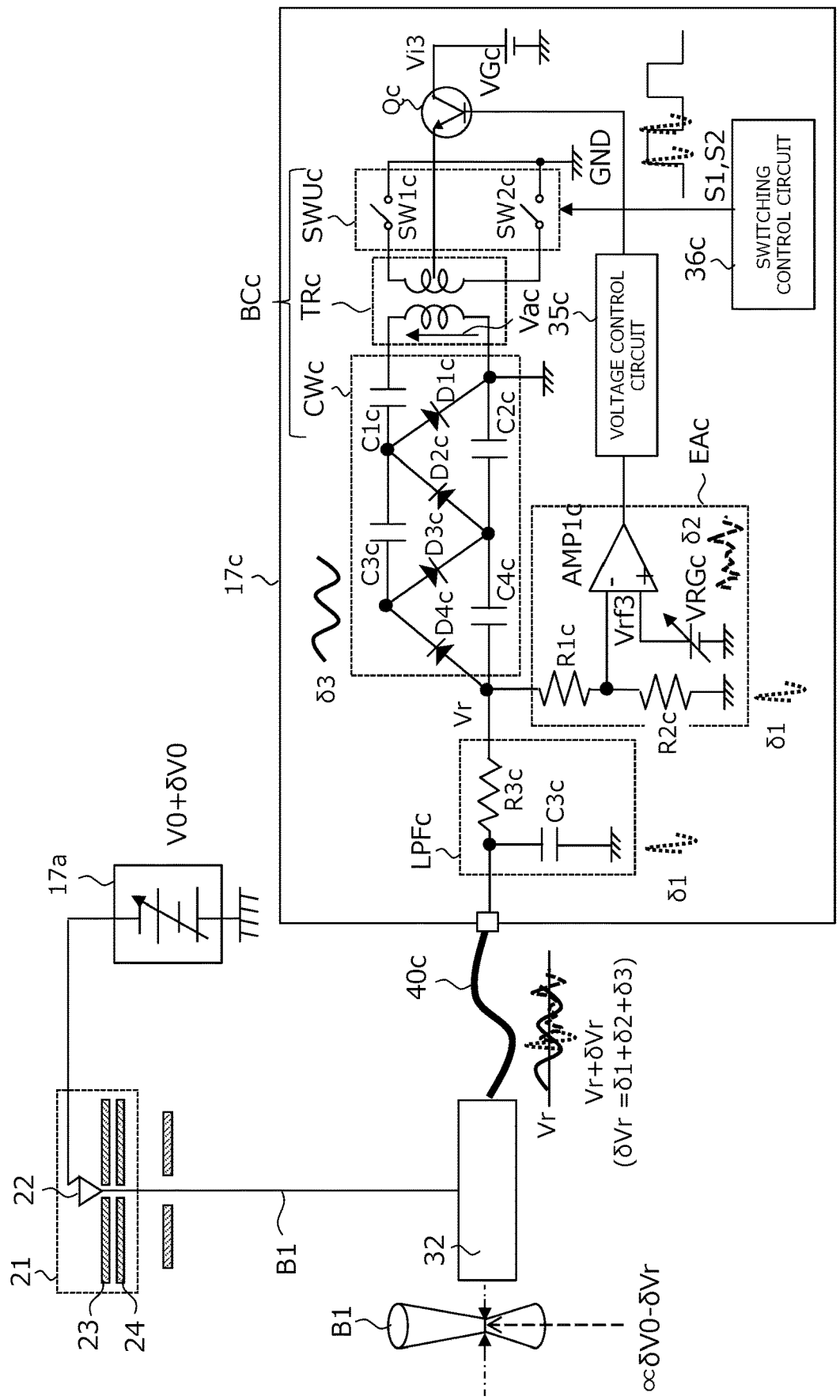
FIG. 2 is a circuit diagram illustrating a schematic configuration example of a power supply circuit that generates a retarding voltage in the charged particle beam device of FIG. 1.

FIG. 2 is a circuit diagram illustrating a schematic configuration example of a power supply circuit that generates a retarding voltage in the charged particle beam device of FIG. 1. The power supply circuit 17c illustrated in FIG. 2 includes a constant voltage source VGc, a transistor Qc, a switch unit SWUc, a transformer TRc, a Cockcroft-Walton circuit CWc, a low-pass filter LPFc, an error amplifier EAc, a voltage control circuit 35c, and a switching control circuit 36c. The switch unit SWUc, the transformer TRc, and the Cockcroft-Walton circuit CWc constitute a booster circuit BCc.

The constant voltage source VGc generates an input voltage Vi3. The transistor (for example, a bipolar transistor) Qc steps down the input voltage Vi3 according to a base voltage. The transistor Qc determines the stepped-down voltage as the voltage of a midpoint tap in a primary coil of the transformer TRc. The switch unit SWUc includes two switching elements SW1c and SW2c. The switching elements SW1c and SW2c are respectively connected between both ends of the primary coil of the transformer TRc and the ground power supply GND.

The switching control circuit 36 alternately performs switching control of the two switching elements SW1c and SW2c by switch signals S1 and S2 having a predetermined switching frequency. As a result, an AC voltage having an amplitude equal to the input voltage Vi3 is supplied to the primary coil of the transformer TRc. In addition, a secondary coil of the transformer TRc outputs an AC voltage Vac corresponding to a coil winding ratio and the like. As described above, the switching elements SW1c and SW2c are elements for supplying an AC voltage to the primary coil of the transformer TRc.

The Cockcroft-Walton circuit CWc includes a plurality of (four in this example) capacitors C1c, C2c, C3c, and C4c and a plurality of (four) diodes D1c, D2c, D3c, and D4c. The Cockcroft-Walton circuit CWc converts the AC voltage Vac from the secondary coil of the transformer TRc into a DC voltage while boosting the AC voltage Vac. In the example of FIG. 2, the Cockcroft-Walton circuit CWc generates a DC voltage having a magnitude approximately four times the amplitude of the AC voltage Vac as the retarding voltage Vr. In addition, the multiple of the boosting is appropriately adjusted by the number of stages of the capacitor and the diode.

The error amplifier EAc includes voltage dividing resistance elements R1c and R2c, an amplifier AMP1c, and a reference voltage source VRGc. The reference voltage source VRGc generates a reference voltage Vrf3. The reference voltage Vrf3 is a voltage for setting the magnitude of the retarding voltage Vr. The voltage dividing resistance elements R1c and R2c divide the retarding voltage Vr generated by the Cockcroft-Walton circuit CWc. The amplifier AMP1c amplifies an error between the divided voltage value and the reference voltage Vrf3.

The voltage control circuit 35c performs feedback control of the base voltage of the transistor Qc according to an error signal from the error amplifier EAc. As a result, the amplitude of the AC voltage Vac from the transformer TRc is controlled, and thus the retarding voltage Vr is controlled to have a magnitude corresponding to the reference voltage Vrf3. The low-pass filter LPFc includes a resistance element R3c and a capacitor C3c, and filters the retarding voltage Vr from the Cockcroft-Walton circuit CWc. Then, the power supply circuit 17c supplies the filtered retarding voltage Vr to the sample 32 (specifically, the stage 31) via a power cable 40c.

Here, as illustrated in FIG. 2, the power supply circuit 17c includes three noise sources. A first noise source is a switching noise ($\delta 1$) caused by switching of the switch signals S1 and S2 from the switching control circuit 36c. The switching noise ($\delta 1$) is also a noise of the ground power supply GND. A second noise source is a random noise ($\delta 2$) generated in the reference voltage source VRGc.

A third noise source is a ripple noise ($\delta 3$) caused by a boosting operation of the Cockcroft-Walton circuit CWc. That is, the Cockcroft-Walton circuit CWc performs the boosting operation by operating a charge pump in synchronization with the AC voltage Vac. Therefore, the ripple noise ($\delta 3$) corresponding to the switching frequency of the switching control circuit 36c may be generated. Each of these noises ($\delta 1$, $\delta 2$, and $\delta 3$) can be removed to some extent by the low-pass filter LPFc. However, in order to further improve the resolution of the electron beam B1, it is desirable to further reduce the influence of such noises.

Specifically, the energy of the electron beam B1 is determined by, for example, a differential voltage between the accelerating voltage V0 from the power supply circuit 17a and the retarding voltage Vr from the power supply circuit 17c. Here, a noise voltage $\delta Vr$ (=$\delta 1+\delta 2+\delta 3$) is superimposed on the retarding voltage Vr due to the noise source as described above. In addition, the power supply circuit 17a has the same configuration as the power supply circuit 17c. Accordingly, the same noise voltage $\delta V0$ is superimposed on the accelerating voltage V0.

As a result, a fluctuation component that is equivalent to a difference (=$\delta V0-\delta Vr$) between the noise voltage $\delta V0$ superimposed on the accelerating voltage V0 and the noise voltage $\delta Vr$ superimposed on the retarding voltage Vr is generated in the energy of the electron beam B1. As illustrated in FIG. 2, the fluctuation component causes a focus variation of the electron beam B1 and lowers the resolution of the electron beam B1. Therefore, it is beneficial to use the configuration example of FIG. 3 and the like.

Figure 3:
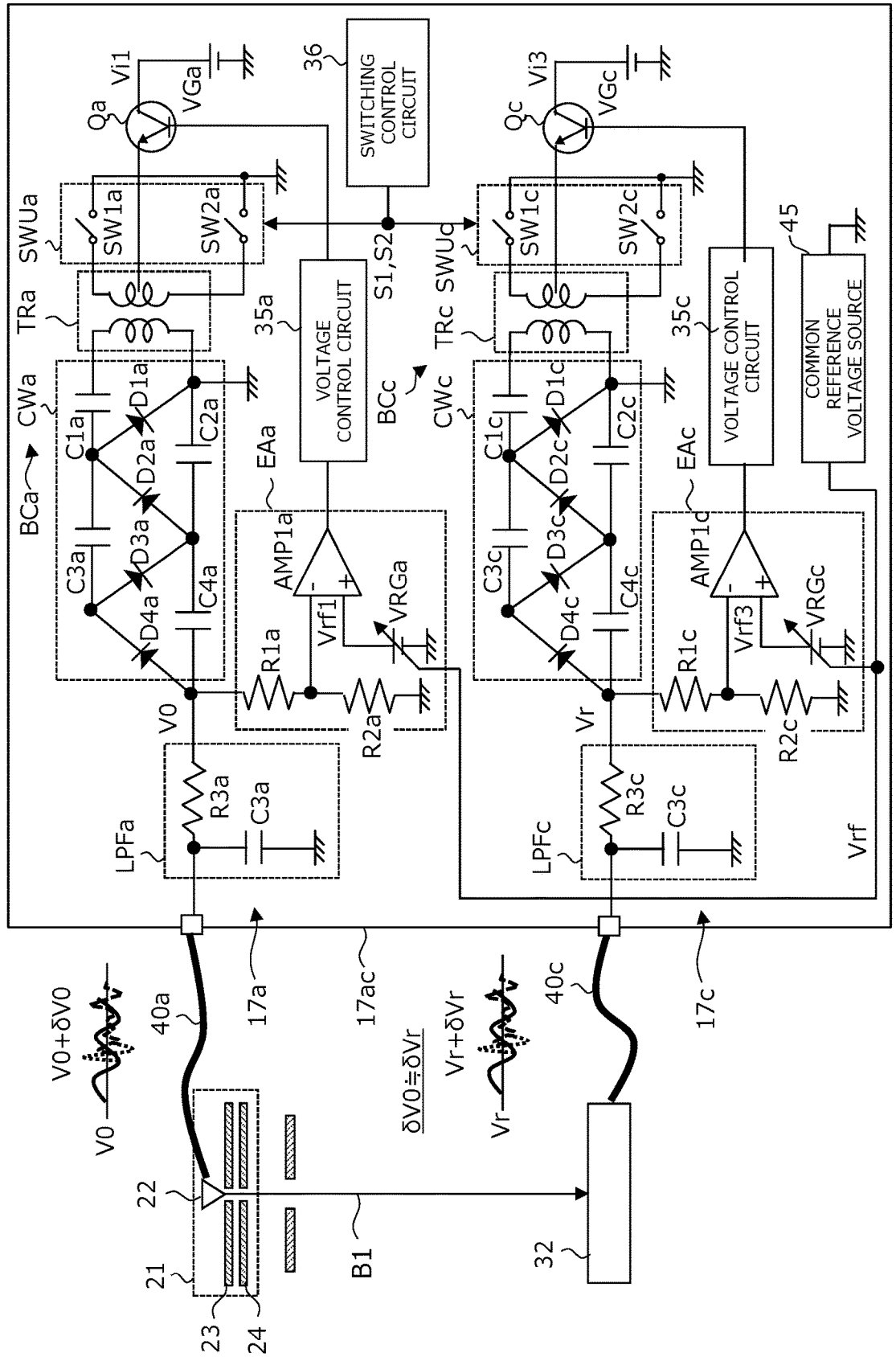
FIG. 3 is a circuit diagram illustrating a schematic configuration example of a power supply circuit that generates an accelerating voltage and a retarding voltage in the charged particle beam device of FIG. 1.
Figure 4:
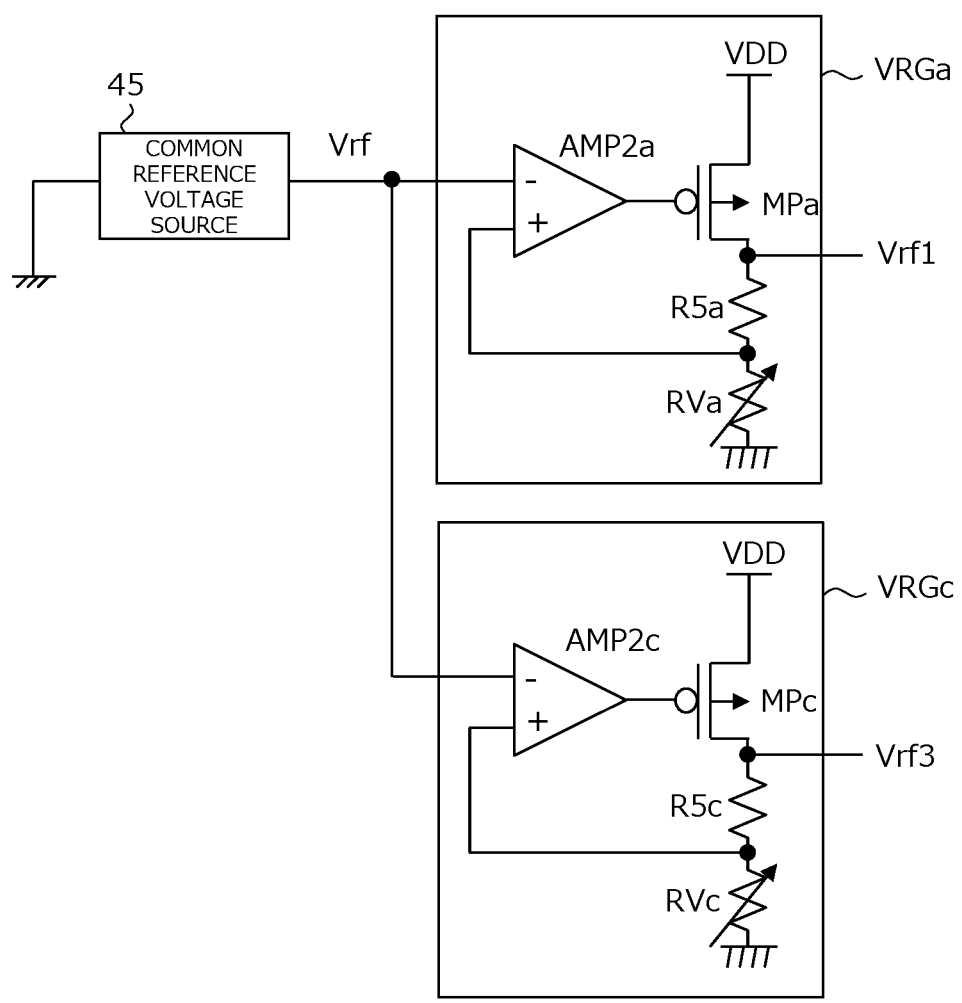
FIG. 4 is a circuit diagram illustrating a configuration example around a common reference voltage source in FIG. 3.
Figure 5A:
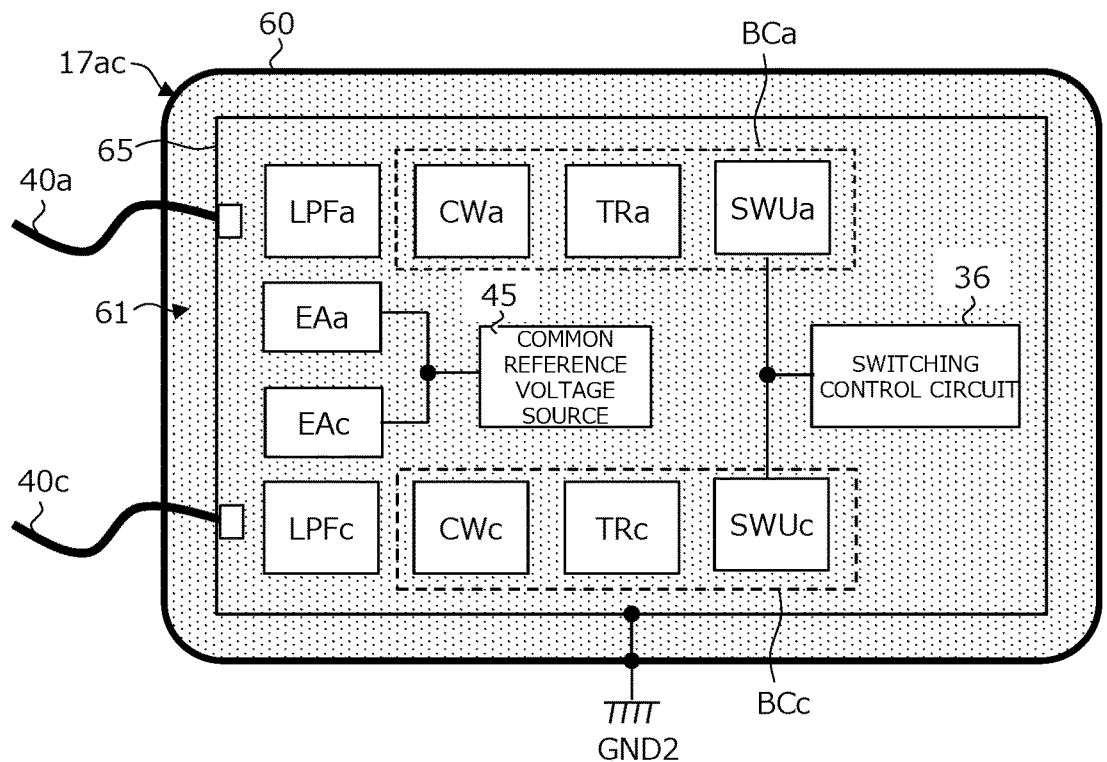
FIG. 5A is a schematic diagram illustrating an implementation example of the power supply circuit of FIG. 3.
Figure 5B:
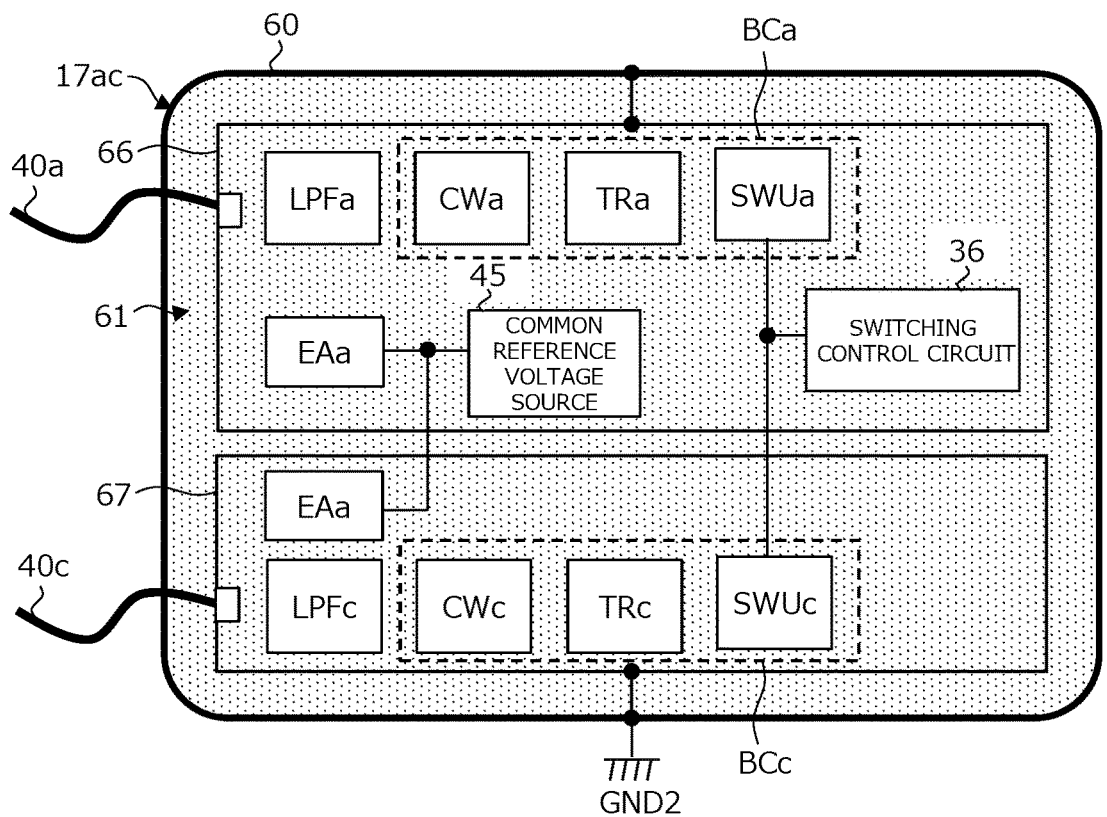
FIG. 5B is a schematic diagram illustrating an implementation example different from that of FIG. 5A.

FIG. 3 is a circuit diagram illustrating a schematic configuration example of a power supply circuit (power supply device) that generates an accelerating voltage and a retarding voltage in the charged particle beam device of FIG. 1. FIG. 4 is a circuit diagram illustrating a configuration example around a common reference voltage source in FIG. 3. FIG. 5A is a schematic diagram illustrating an implementation example of the power supply circuit (power supply device) of FIG. 3, and FIG. 5B is a schematic diagram illustrating an implementation example different from that of FIG. 5A.

A power supply circuit (power supply device) 17ac illustrated in FIG. 3 includes two power supply circuits 17a and 17c. The power supply circuit 17c is a circuit that generates the retarding voltage Vr, and has substantially the same configuration as that of FIG. 2. The power supply circuit 17a is a circuit that generates the accelerating voltage V0, and has substantially the same configuration as that of FIG. 2. Briefly, the power supply circuit 17a includes a constant voltage source VGa, a transistor Qa, a switch unit SWUa, a transformer TRa, a Cockcroft-Walton circuit CWa, a low-pass filter LPFa, an error amplifier EAa, and a voltage control circuit 35a. The switch unit SWUa, the transformer TRa, and the Cockcroft-Walton circuit CWa constitute a booster circuit BCa.

The constant voltage source VGa generates an input voltage Vi1. The transistor Qa steps down the input voltage Vi1 according to the base voltage, and determines the stepped-down voltage as the voltage of a midpoint tap in a primary coil of the transformer TRa. The switch unit SWUa includes two switching elements SW1a and SW2a. The Cockcroft-Walton circuit CWa includes a plurality of (four in this example) capacitors C1a, C2a, C3a, and C4a and a plurality of (four) diodes D1a, D2a, D3a, and D4a, and generates the accelerating voltage V0 as a boosted DC voltage.

The error amplifier EAa includes voltage dividing resistance elements R1a and R2a, an amplifier AMP1a, and a reference voltage source VRGa. The reference voltage source VRGa generates a reference voltage Vrf1. The reference voltage Vrf1 is a voltage for setting the magnitude of the accelerating voltage V0. The voltage dividing resistance elements R1a and R2a divide the accelerating voltage V0, and the amplifier AMP1a amplifies an error between the divided voltage value and the reference voltage Vrf1. The voltage control circuit 35a performs feedback control of the base voltage of the transistor Qa according to an error signal from the error amplifier EAa. The low-pass filter LPFa includes a resistance element R3a and a capacitor C3a, and filters the accelerating voltage V0. Then, the power supply circuit 17a supplies the filtered accelerating voltage V0 to the electron gun 21 via a power cable 40a.

Here, the configuration example of FIG. 3 differs from a configuration obtained by simply extending the configuration of FIG. 2, and mainly includes the following three features. As Feature [1], the power supply circuit 17ac includes a switching control circuit 36. The switching control circuit 36 performs switching control of the switch unit SWUa of the booster circuit BCa and the switch unit SWUc of the booster circuit BCc with common switch signals S1 and S2.

Thus, the ripple noise superimposed on the accelerating voltage V0 ($\delta 3$ in the noise voltage $\delta V0$) and the ripple noise superimposed on the retarding voltage Vr ($\delta 3$ in the noise voltage $\delta Vr$) as illustrated in FIG. 2 have the same frequency and the same phase, and cancel each other out. Furthermore, the switching noise superimposed on the accelerating voltage V0 (δ1 in the noise voltage δV0) and the switching noise superimposed on the retarding voltage Vr (δ1 in the noise voltage δVr) also have the same frequency and the same phase, and cancel each other out. As a result, the focus variation of the electron beam B1 can be reduced, and the high resolution of the electron beam B1 can be achieved.

As Feature [2], the power supply circuit 17ac includes a common reference voltage source 45. The common reference voltage source 45 supplies a common reference voltage Vrf to the reference voltage source VRGa of the power supply circuit 17a and the reference voltage source VRGc of the power supply circuit 17c. As a specific example, as illustrated in FIG. 4, the reference voltage source VRGa includes, for example, a pMOS transistor MPa, voltage dividing resistance elements R5a and RVa, and an amplifier AMP2a. A source of the pMOS transistor MPa is connected to an internal power supply VDD for control.

The voltage dividing resistance elements R5a and RVa divide the reference voltage Vrf1 output from a drain of the pMOS transistor MPa. The amplifier AMP2a performs feedback control of a gate of the pMOS transistor MPa such that the divided voltage coincides with the reference voltage Vrf from the common reference voltage source 45. The resistance element RVa is a variable resistance element. The voltage value of the reference voltage Vrf1 is variably controlled by the resistance value of the resistance element RVa.

Similarly, the reference voltage source VRGc includes, for example, a pMOS transistor MPc, voltage dividing resistance elements R5c and RVc, and an amplifier AMP2c. The reference voltage Vrf from the common reference voltage source 45 is input to the amplifier AMP2c. In addition, the common reference voltage source 45 is typically a band gap reference circuit or the like. In addition, the reference voltage sources VRGa and VRGc are not limited to the circuit illustrated in FIG. 4, and may be configured by various circuits which are generally known.

Thus, by providing the common reference voltage source 45, the random noise (δ2 in the noise voltage δV0) superimposed on the accelerating voltage V0 as illustrated in FIG. 2 and the random noise (δ2 in the noise voltage δVr) superimposed on the retarding voltage Vr become substantially equal to each other and cancel each other out. As a result, the focus variation of the electron beam B1 can be reduced, and the high resolution of the electron beam B1 can be achieved.

As Feature [3], the ground power supply GND of the booster circuit BCa and the ground power supply GND of the booster circuit BCc are commonly connected in the power supply circuit 17ac before being connected to the housing 19 illustrated in FIG. 1. Specifically, as illustrated in FIG. 5A or 5B, the ground power supply of the power supply circuit 17a including the booster circuit BCa and the ground power supply of the power supply circuit 17c including the booster circuit BCc are connected to a housing 60 of the power supply circuit (power supply device) 17ac and are connected to the housing 19 of the main body unit 15 illustrated in FIG. 1 via the housing 60.

In the example of FIG. 5A, the booster circuits BCa and BCc, the low-pass filters LPFa and LPFc, the error amplifiers EAa and EAc, the common reference voltage source 45, the switching control circuit 36, and the voltage control circuits 35a and 35c (not illustrated) are mounted on one wiring board 65. The ground power supply of each circuit is commonly connected to a ground layer of the wiring board 65. In addition, the wiring board 65 is housed in the housing 60 of the power supply circuit (power supply device) 17ac, and is sealed by an insulating resin member 61 in the housing 60.

The housing 60 is formed of a metal member and is connected to a ground power supply GND2. The ground layer of the wiring board 65 is connected to the housing 60 (the ground power supply GND2). The housing 60 (the ground power supply GND2) of the power supply circuit 17ac is separately connected to the housing 19 (the ground power supply GND) of the main body unit 15 illustrated in FIG. 1.

In the example of FIG. 5B, the booster circuit BCa, the low-pass filter LPFa, the error amplifier EAa, the common reference voltage source 45, the switching control circuit 36, and the voltage control circuit 35a (not illustrated) are mounted on a wiring board 66. In addition, the booster circuit BCc, the low-pass filter LPFc, the error amplifier EAc, and the voltage control circuit 35c (not illustrated) are mounted on another wiring board 67. Each of the reference voltage Vrf from the common reference voltage source 45 and the switch signals S1 and S2 from the switching control circuit 36 is transmitted to the wiring board 67 via a predetermined signal cable.

The two wiring boards 66 and 67 are housed in the housing 60 of the power supply circuit 17ac, and are sealed by the insulating resin member 61 in the housing 60. The ground layer of the wiring board 66 and the ground layer of the wiring board 67 are both connected to the housing 60 (the ground power supply GND2), and are separately connected to the housing 19 (the ground power supply GND) of the main body unit 15 via the housing 60. Thus, by sharing the ground power supplies of the two booster circuits BCa and BCc before being shared by the housing 19 of the main body unit 15, it is possible to further match the ground power supply voltages of the two booster circuits BCa and BCc.

That is, a cancellation effect of each of the noises (δ1 to δ3) described above can be further improved as the ground power supply voltages of the two booster circuits BCa and BCc become more equal. Meanwhile, in a general form, for example, the two booster circuits BCa and BCc are mounted in different housings, respectively, and the ground power supplies of the two booster circuits BCa and BCc are commonly used in the housing 19 of the main body unit 15. In this case, a differential voltage is likely to occur between the ground power supply voltages of the two booster circuits BCa and BCc. Therefore, for example, by using a mounting method as illustrated in FIGS. 5A and 5B, it is possible to reduce the differential voltage. As a result, the focus variation of the electron beam B1 can be reduced, and the high resolution of the electron beam B1 can be achieved.

<<Main Effects of First Embodiment>>

As described above, by using the power supply circuit (power supply device) 17ac of the first embodiment, it is possible to reduce noise generated between a plurality of voltages. Accordingly, the resolution of the electron beam B1 can be improved by applying the power supply circuit 17ac to the accelerating voltage V0 and the retarding voltage Vr of the charged particle beam device 10. In this example, the power supply circuit (power supply device) 17ac is applied to the charged particle beam device 10, but the invention is not limited to this, and the power supply circuit (power supply device) 17ac can be similarly applied to various devices that perform a predetermined control based on a differential voltage between a plurality of voltages. In addition, this example shows that two power supply circuits are integrated, but three or more power supply circuits may be integrated in the same manner.

Second Embodiment

<<Details of Power Supply Circuit (Power Supply Device)>>

Figure 6:
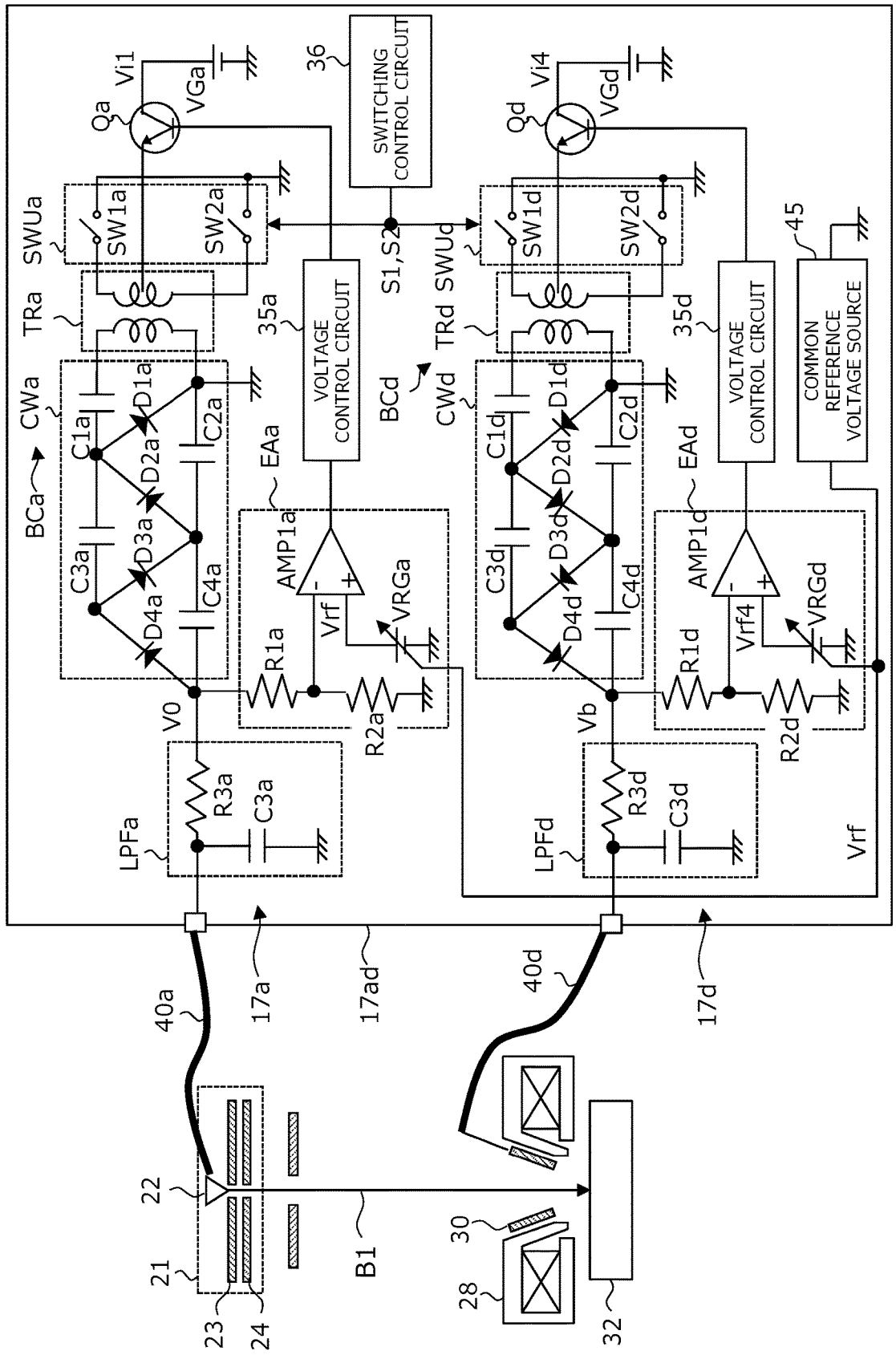
FIG. 6 is a circuit diagram illustrating a schematic configuration example of a power supply circuit that generates an accelerating voltage and a boost voltage in FIG. 1 in a charged particle beam device according to a second embodiment of the invention.

FIG. 6 is a circuit diagram illustrating a schematic configuration example of a power supply circuit (power supply device) that generates an accelerating voltage and a boost voltage in FIG. 1 in a charged particle beam device according to a second embodiment of the invention. A power supply circuit (power supply device) 17ad illustrated in FIG. 6 includes two power supply circuits 17a and 17d. In the power supply circuit 17ad illustrated in FIG. 6, the power supply circuit 17c in FIG. 3 is replaced with the power supply circuit 17d in FIG. 6 as compared with the power supply circuit 17ac illustrated in FIG. 3. That is, the power supply circuit 17a is a circuit that generates the accelerating voltage V0, and has the same configuration as that of FIG. 3. The power supply circuit 17d is a circuit that generates the boost voltage Vb, and has substantially the same configuration as that of the power supply circuit 17a.

Briefly, the power supply circuit 17d includes a constant voltage source VGd, a transistor Qd, a switch unit SWUd, a transformer TRd, a Cockcroft-Walton circuit CWd, a low-pass filter LPFd, an error amplifier EAd, and a voltage control circuit 35d. The switch unit SWUd, the transformer TRd, and the Cockcroft-Walton circuit CWd constitute a booster circuit BCd.

The constant voltage source VGd generates an input voltage Vi4. The transistor Qd steps down the input voltage Vi4 according to the base voltage, and determines the stepped-down voltage as the voltage of a midpoint tap in a primary coil of the transformer TRd. The switch unit SWUd includes two switching elements SW1d and SW2d.

The Cockcroft-Walton circuit CWd includes a plurality of (four in this example) capacitors C1d, C2d, C3d, and C4d and a plurality of (four) diodes D1d, D2d, D3d, and D4d, and generates the boost voltage Vb as a boosted DC voltage. Since the boost voltage Vb is a positive voltage unlike the accelerating voltage V0, the diode in the Cockcroft-Walton circuit CWd and the diode in the Cockcroft-Walton circuit CWa have different anode and cathode directions.

The error amplifier EAd includes voltage dividing resistance elements R1d and R2d, an amplifier AMP1d, and a reference voltage source VRGd. The reference voltage source VRGd generates a reference voltage Vrf4. The reference voltage Vrf4 is a voltage for setting the magnitude of the boost voltage Vb. The voltage dividing resistance elements R1d and R2d divide the boost voltage Vb, and the amplifier AMP1d amplifies an error between the divided voltage value and the reference voltage Vrf4. The voltage control circuit 35d performs feedback control of the base voltage of the transistor Qd according to an error signal from the error amplifier EAd.

The switching control circuit 36 performs switching control of the switch unit SWUa of the booster circuit BCa and the switch unit SWUd of the booster circuit BCd with common switch signals S1 and S2. The common reference voltage source 45 supplies a common reference voltage Vrf to the reference voltage source VRGa of the power supply circuit 17a and the reference voltage source VRGd of the power supply circuit 17d. The low-pass filter LPFd includes a resistance element R3d and a capacitor C3d, and filters the boost voltage Vb. Then, the power supply circuit 17d supplies the filtered boost voltage Vb to the boost electrode 30 via a power cable 40d.

<<Main Effects of Second Embodiment>>

As described above, by using the power supply circuit (power supply device) 17ad of the second embodiment, it is also possible to reduce noise generated between a plurality of voltages as in the case of the first embodiment. Accordingly, the resolution of the electron beam B1 can be improved by applying the power supply circuit 17ad to the accelerating voltage V0 and the boost voltage Vb of the charged particle beam device 10.

Third Embodiment

<<Details of Power Supply Circuit (Power Supply Device)>>

Figure 7:
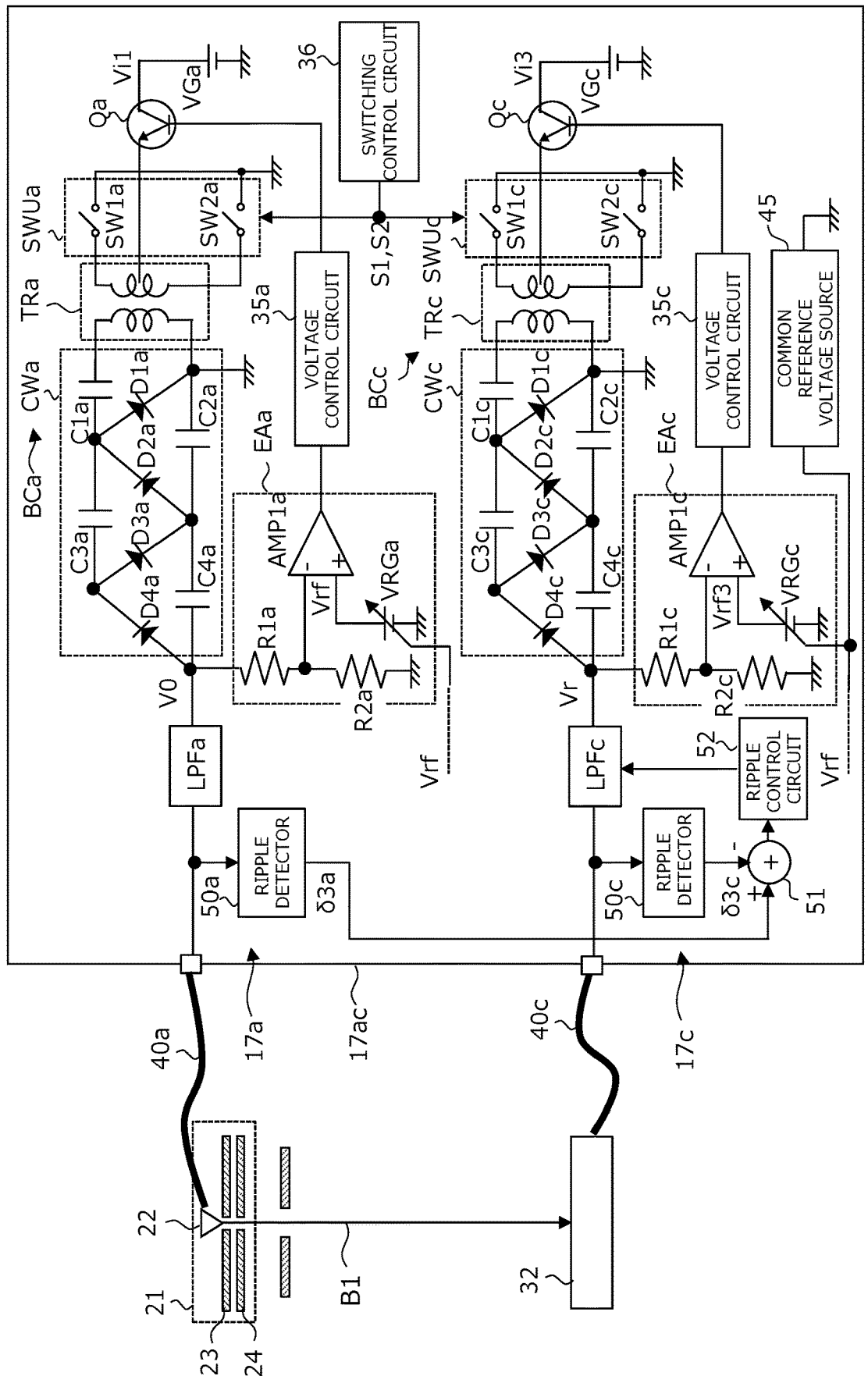
FIG. 7 is a circuit diagram illustrating a schematic configuration example of a power supply circuit that generates an accelerating voltage and a retarding voltage in FIG. 1 in a charged particle beam device according to a third embodiment of the invention.

FIG. 7 is a circuit diagram illustrating a schematic configuration example of a power supply circuit (power supply device) that generates an accelerating voltage and a retarding voltage in FIG. 1 in a charged particle beam device according to a third embodiment of the invention. As in the case of FIG. 3, the power supply circuit (power supply device) 17ac illustrated in FIG. 7 includes the power supply circuit 17a that generates the accelerating voltage V0 and the power supply circuit 17c that generates the retarding voltage Vr.

However, in the power supply circuit 17ac of FIG. 7, ripple detectors 50a and 50c, a differential voltage detector 51, and a ripple control circuit 52 are added to the configuration example of FIG. 3. The ripple detector 50a detects a ripple voltage δ3a superimposed on the accelerating voltage V0 output from the low-pass filter LPFa. Similarly, the ripple detector 50c detects a ripple voltage δ3c superimposed on the retarding voltage Vr output from the low-pass filter LPFc. The ripple detectors 50a and 50c are formed of, for example, a band-pass filter that detects a switching frequency component in the switching control circuit 36 for each of the voltages (V0 and Vr).

The differential voltage detector 51 detects a differential voltage between the ripple voltage δ3a from the ripple detector 50a and the ripple voltage δ3c from the ripple detector 50c. The ripple control circuit 52 feeds back the differential voltage (for example, "δ3a−δ3c") obtained from the differential voltage detector 51 to one of the accelerating voltage V0 and the retarding voltage Vr. In this example, the ripple control circuit 52 feeds back the differential voltage obtained from the differential voltage detector 51 to the retarding voltage Vr, and more specifically, feeds back the differential voltage to the low-pass filter LPFc.

Figure 8:
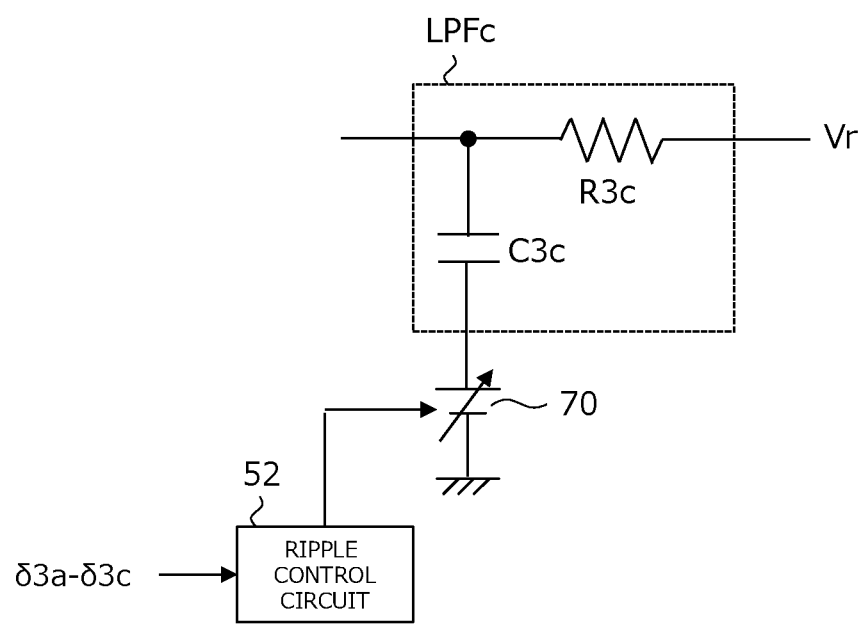
FIG. 8 is a schematic diagram illustrating a configuration example around a ripple control circuit and a low-pass filter illustrated in FIG. 7.

FIG. 8 is a schematic diagram illustrating a configuration example around a ripple control circuit and a low-pass filter illustrated in FIG. 7. In the example of FIG. 8, a variable voltage source 70 is provided between the ground power supply GND and the capacitor C3c of the low-pass filter LPFc. The ripple control circuit 52 sets the differential voltage ("δ3a−δ3c") obtained from the differential voltage detector 51 to the variable voltage source 70. As a result, the ripple voltage δ3c can be brought close to the ripple voltage δ3a, and the differential voltage ("δ3a−δ3c") can be further reduced.

Here, when the method of the first embodiment is used, it is possible to match the frequencies and phases of the ripple voltages δ3a and δ3c. However, the amplitudes of the ripple voltages δ3a and δ3c may be different from each other. Generally, as the generated voltages (V0 and Vr) increase, the amplitude of the ripple voltage also increases. Therefore, the amplitude of the ripple voltage may vary depending on the magnitude of the generated voltages. As a result, the cancellation effect of the noises described above may be weakened. Therefore, it is beneficial to use the method as illustrated in FIGS. 7 and 8.

In addition, the method of reflecting the differential voltage obtained from the differential voltage detector 51 in the low-pass filter is not limited to the method illustrated in FIG. 8, and various methods can be used. For example, here, on the assumption that the ripple voltage δ3a superimposed on the accelerating voltage V0 is larger than the ripple voltage δ3c superimposed on the retarding voltage Vr, a method of adding the differential voltage ("δ3a−δ3c") to the node of the low-pass filter LPFc is used. In contrast, a method of subtracting the differential voltage ("δ3a−δ3c") from the node of the low-pass filter LPFa may be used. In addition, the nodes at which the addition or subtraction is performed are not limited to those illustrated in FIG. 8, and may be changed as appropriate.

<<Main Effects of Third Embodiment>>

As described above, by using the power supply circuit (power supply device) 17ac of the third embodiment, in addition to the effect described in the first embodiment, it is possible to further reduce the noise generated between a plurality of voltages. Specifically, the noise caused by a ripple component can be further reduced. As a result, it is possible to further improve the resolution of the electron beam B1.

Fourth Embodiment

<<Details of Power Supply Circuit (Power Supply Device)>>

Figure 9:
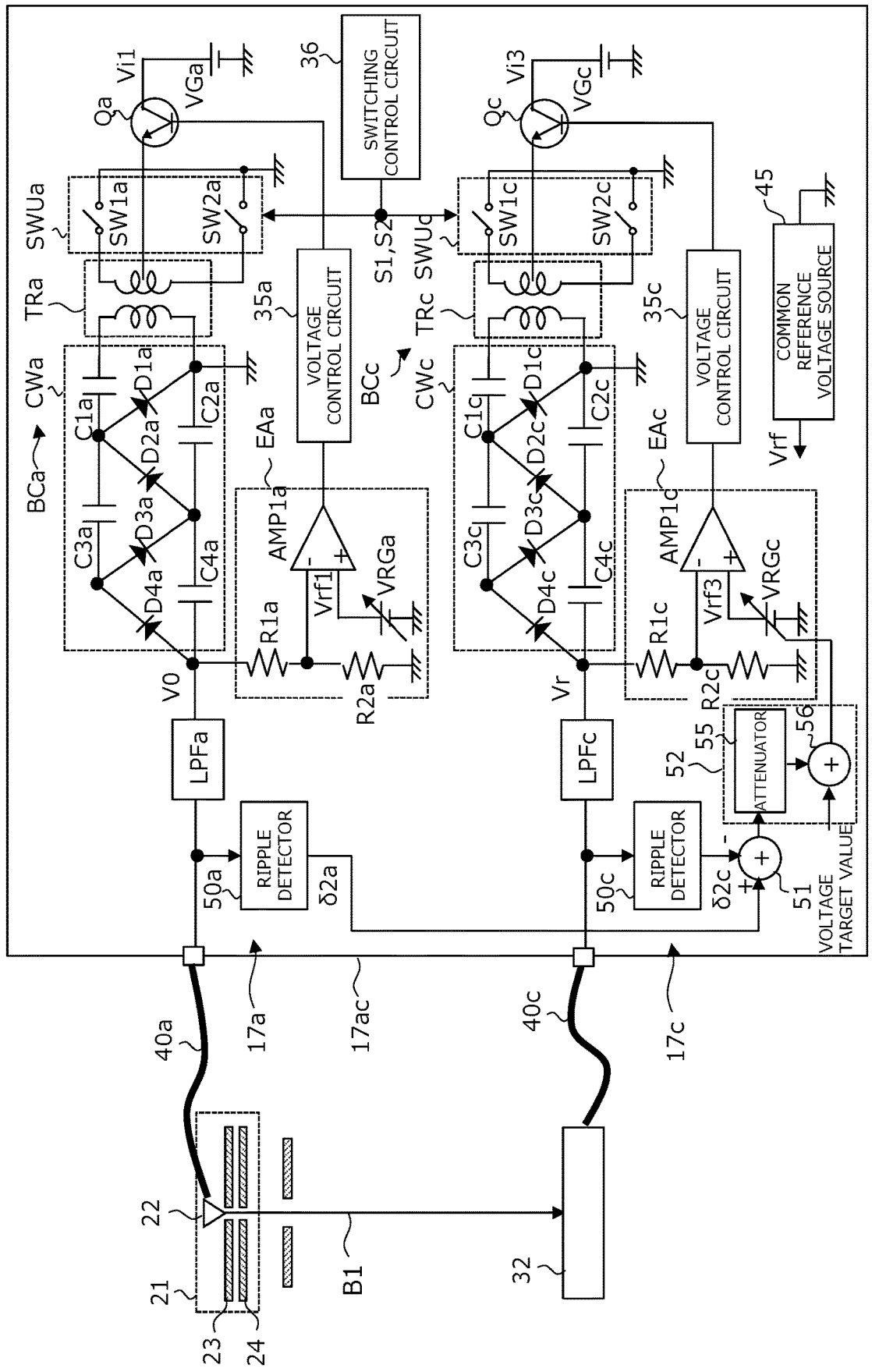
FIG. 9 is a circuit diagram illustrating a schematic configuration example of a power supply circuit that generates an accelerating voltage and a retarding voltage in FIG. 1 in a charged particle beam device according to a fourth embodiment of the invention.

FIG. 9 is a circuit diagram illustrating a schematic configuration example of a power supply circuit (power supply device) that generates an accelerating voltage and a retarding voltage in FIG. 1 in a charged particle beam device according to a fourth embodiment of the invention. In the power supply circuit (power supply device) 17ac illustrated in FIG. 9, the configuration of the ripple control circuit 52 is different as compared with the configuration example of FIG. 7. The ripple control circuit 52 illustrated in FIG. 9 feeds back the differential voltage (for example, "δ3a−δ3c") obtained from the differential voltage detector 51 to the reference voltage source VRGc in the error amplifier EAc.

Specifically, the ripple control circuit 52 of FIG. 9 includes an attenuator 55 and an adder 56. The attenuator 55 attenuates the differential voltage obtained from the differential voltage detector 51. An attenuation ratio in this case is determined to be, for example, a voltage dividing ratio of the voltage dividing resistance elements R1c and R2c in the error amplifier EAc. The adder 56 adds the voltage value obtained from the attenuator 55 to a voltage target value that determines the magnitude of the retarding voltage Vr, and sets the added voltage value to the reference voltage source VRGc. By using such a set value of the reference voltage source VRGc, it is possible to bring the ripple voltage δ3c superimposed on the retarding voltage Vr close to the ripple voltage δ3a included in the accelerating voltage V0, as in the case of the third embodiment.

<<Main Effects of Fourth Embodiment>>

As described above, by using the power supply circuit (power supply device) 17ac of the fourth embodiment, the same effect as that of the third embodiment can be exerted. In addition, such an effect can be exerted by using the existing reference voltage source VRGc as it is.

As described above, the invention made by the present inventors are specifically described based on the embodiments, but the invention is not limited to the embodiments, and various modifications can be made without departing from the gist of the invention. For example, the embodiments described above are described in detail for easy understanding of the invention, and the invention is not necessarily limited to those including all the configurations described above. In addition, a part of the configuration of one embodiment can be replaced with the configuration of another embodiment, and the configuration of another embodiment can be added to the configuration of one embodiment. In addition, a part of the configuration of each embodiment may be added, deleted, or replaced with another configuration.

What is claimed is:

1. A charged particle beam device comprising:
   a charged particle gun configured to emit a charged particle beam;
   a stage on which a sample is to be placed; and
   a power supply circuit configured to generate a first voltage and a second voltage that determine energy of the charged particle beam and supply the first voltage to the charged particle gun, wherein
   the power supply circuit includes
      a first booster circuit configured to generate the first voltage,
      a second booster circuit configured to generate the second voltage, and
      a switching control circuit configured to perform switching control of the first booster circuit and the second booster circuit using a common switch signal.

2. The charged particle beam device according to claim 1, wherein
   the charged particle gun is housed in a first housing, and
   a ground power supply of the first booster circuit and a ground power supply of the second booster circuit are commonly connected before being connected to the first housing.

3. The charged particle beam device according to claim 2, wherein
   the first booster circuit and the second booster circuit are housed in a second housing, and
   a ground power supply of the first booster circuit and a ground power supply of the second booster circuit are connected to the second housing and are connected to the first housing via the second housing.

4. The charged particle beam device according to claim 1, further comprising:
   a first reference voltage source configured to generate a first reference voltage for setting a magnitude of the first voltage;
   a second reference voltage source configured to generate a second reference voltage for setting a magnitude of the second voltage; and
   a common reference voltage source configured to supply a common reference voltage to the first reference voltage source and the second reference voltage source.

5. The charged particle beam device according to claim 1, further comprising:
   a first ripple detector configured to detect a first ripple voltage superimposed on the first voltage;
   a second ripple detector configured to detect a second ripple voltage superimposed on the second voltage; and a ripple control circuit configured to feed back a differential voltage between the first ripple voltage and the second ripple voltage to one of the first voltage and the second voltage.

6. The charged particle beam device according to claim 1, wherein
the first booster circuit and the second booster circuit each include
a transformer,
a switching element configured to supply an AC voltage to a primary coil of the transformer, and
a Cockcroft-Walton circuit configured to boost a voltage of a secondary coil of the transformer, and
the switching control circuit performs switching control of the switching element.

7. The charged particle beam device according to claim 1, wherein
the second voltage is supplied to the stage.

8. The charged particle beam device according to claim 1, wherein
the second voltage is supplied to a booster electrode configured to further accelerate the charged particle beam accelerated by the first voltage.

9. A power supply device that supplies a first voltage and a second voltage, the power supply device comprising:
a first booster circuit configured to supply the first voltage;
a second booster circuit configured to supply the second voltage; and
a switching control circuit configured to perform switching control of the first booster circuit and the second booster circuit using a common switch signal.

10. The power supply device according to claim 9, wherein
the first booster circuit and the second booster circuit are housed in a same housing, and
a ground power supply of the first booster circuit and a ground power supply of the second booster circuit are connected to the same housing.

11. The power supply device according to claim 9, further comprising:
a first reference voltage source configured to generate a first reference voltage for setting a magnitude of the first voltage;
a second reference voltage source configured to generate a second reference voltage for setting a magnitude of the second voltage; and
a common reference voltage source configured to supply a common reference voltage to the first reference voltage source and the second reference voltage source.

12. The power supply device according to claim 9, further comprising:
a first ripple detector configured to detect a first ripple voltage superimposed on the first voltage;
a second ripple detector configured to detect a second ripple voltage superimposed on the second voltage; and
a ripple control circuit configured to feed back a differential voltage between the first ripple voltage and the second ripple voltage to one of the first voltage and the second voltage.

13. The power supply device according to claim 12, further comprising:
a first low-pass filter configured to filter the first voltage; and
a second low-pass filter configured to filter the second voltage, wherein
the ripple control circuit feeds back a differential voltage between the first ripple voltage and the second ripple voltage to one of the first low-pass filter and the second low-pass filter.

14. The power supply device according to claim 12, further comprising:
a first reference voltage source configured to generate a first reference voltage for setting a magnitude of the first voltage; and
a second reference voltage source configured to generate a second reference voltage for setting a magnitude of the second voltage, wherein
the ripple control circuit feeds back a differential voltage between the first ripple voltage and the second ripple voltage to one of the first reference voltage source and the second reference voltage source.

15. The power supply device according to claim 9, wherein
the first booster circuit and the second booster circuit each include
a transformer,
a switching element configured to supply an AC voltage to a primary coil of the transformer, and
a Cockcroft-Walton circuit configured to boost a voltage of a secondary coil of the transformer, and
the switching control circuit performs switching control of the switching element.

\* \* \* \* \*